United States Patent
Staev et al.

(10) Patent No.: US 11,251,793 B2
(45) Date of Patent: Feb. 15, 2022

(54) DRIVE SYSTEM FOR VENDING MACHINE

(71) Applicant: Nidec Motor Corporation, St. Louis, MO (US)

(72) Inventors: Stoyan Staev, Lombard, IL (US); Eric Hancock, Huntley, IL (US); Paul Vanaria, Carol Stream, IL (US)

(73) Assignee: Nidec Motor Corporation

( * ) Notice: Subject to any disclaimer, the term of this patent is extended or adjusted under 35 U.S.C. 154(b) by 0 days.

(21) Appl. No.: 16/879,249

(22) Filed: May 20, 2020

(65) Prior Publication Data
US 2020/0286325 A1 Sep. 10, 2020

Related U.S. Application Data

(63) Continuation of application No. 16/168,508, filed on Oct. 23, 2018, now abandoned.

(60) Provisional application No. 62/575,865, filed on Oct. 23, 2017, provisional application No. 62/699,509, filed on Jul. 17, 2018.

(51) Int. Cl.
| | |
|---|---|
| *G07F 11/42* | (2006.01) |
| *G07F 17/00* | (2006.01) |
| *H01B 7/00* | (2006.01) |
| *H03K 17/90* | (2006.01) |
| *G07F 11/60* | (2006.01) |

(52) U.S. Cl.
CPC ............. *H03K 17/90* (2013.01); *G07F 11/60* (2013.01); *G07F 17/0071* (2013.01); *H01B 7/0045* (2013.01); *G07F 11/42* (2013.01)

(58) Field of Classification Search
CPC ...... G07F 11/42; G07F 11/60; G07F 17/0071; H01B 7/0045; H03K 17/90
USPC .................................. 221/298, 241, 131, 75
See application file for complete search history.

(56) References Cited

U.S. PATENT DOCUMENTS

| | | | | |
|---|---|---|---|---|
| 3,762,526 A | * | 10/1973 | Kiefer ....................... | G07F 5/22 194/222 |
| 4,156,820 A | * | 5/1979 | Fukuda ................... | H01L 43/06 307/116 |
| 4,456,943 A | * | 6/1984 | Judy ..................... | G01R 15/202 361/160 |
| 5,172,605 A | * | 12/1992 | Schwartz ................ | F16H 35/10 74/421 A |
| 5,718,119 A | * | 2/1998 | Wakita .................... | F25B 45/00 62/303 |
| 5,842,349 A | * | 12/1998 | Wakita .................... | F25B 47/00 62/85 |

(Continued)

*Primary Examiner* — Rakesh Kumar
(74) *Attorney, Agent, or Firm* — Hovey Williams LLP (57) ABSTRACT

A drive system for a vending or other dispensing machine includes an electronic switch and an electric motor configured to actuate dispensing coils or other dispensing technologies to dispense instances of products. The drive system minimizes the risk of sparking and igniting propane or other volatile refrigerants or other volatile chemicals or materials used in or near the machine. The electronic switch may be a Hall effect switch, and the electric motor may be a brushless DC electric motor. A homing circuit is connected to the drive system to control/monitor actuation of the dispensing mechanism. A wiring harness connects the electronic switch to the electric motor, and may include a connector which can be set to allow the electric motor to operate in a clockwise direction or in a counterclockwise direction.

2 Claims, 8 Drawing Sheets

(56) References Cited

U.S. PATENT DOCUMENTS

| | | | | |
|---|---|---|---|---|
| 5,954,995 A * | 9/1999 | Goble | C09K 5/045 | 252/67 |
| 6,196,008 B1 * | 3/2001 | Fujitaka | F24F 1/0003 | 62/77 |
| 6,875,370 B2 * | 4/2005 | Goble | C09K 5/044 | 252/67 |
| 7,597,214 B2 * | 10/2009 | Levasseur | G07F 11/24 | 221/124 |
| 10,056,806 B2 * | 8/2018 | Hatfield | H02K 7/145 | |
| 2006/0070401 A1 * | 4/2006 | Bae | F28F 9/0265 | 62/504 |
| 2008/0054745 A1 * | 3/2008 | Sentmanat | H02K 21/12 | 310/89 |
| 2009/0037019 A1 * | 2/2009 | Black, Jr. | G07F 11/10 | 700/231 |
| 2010/0152524 A1 * | 6/2010 | Sentmanat | H02K 21/12 | 600/16 |
| 2011/0024441 A1 * | 2/2011 | Marin | G07F 11/42 | 221/2 |
| 2011/0219794 A1 * | 9/2011 | Shiba | B23P 19/04 | 62/125 |
| 2012/0004771 A1 * | 1/2012 | Walker | G07F 11/36 | 700/236 |
| 2012/0277904 A1 * | 11/2012 | Pritchard | G07F 11/04 | 700/232 |
| 2013/0126042 A1 * | 5/2013 | Dewald | G07F 11/44 | 141/105 |
| 2013/0200294 A1 * | 8/2013 | Carr | C09K 5/042 | 252/68 |
| 2015/0176866 A1 * | 6/2015 | Takayama | F25B 49/02 | 62/140 |
| 2015/0203732 A1 * | 7/2015 | Saito | C10M 171/008 | 252/68 |
| 2015/0209920 A1 * | 7/2015 | Shiba | F25B 9/002 | 29/890.035 |
| 2019/0017821 A1 * | 1/2019 | Kasemsadeh | G01C 9/06 | |
| 2019/0044415 A1 * | 2/2019 | Hatfield | H02K 11/33 | |
| 2019/0122479 A1 * | 4/2019 | Staev | G07F 11/60 | |
| 2019/0128207 A1 * | 5/2019 | Blackman | H02P 5/46 | |

* cited by examiner

DRIVE SYSTEM FOR VENDING MACHINE

RELATED APPLICATIONS

The present U.S. non-provisional patent application is a continuation and claims priority benefit of a prior-filed U.S. non-provisional patent application having the same title, Ser. No. 16/168,508, filed Oct. 23, 2018, which is related to and claims priority benefit of a first prior-filed U.S. provisional patent application titled "Brushless Motor and Switch for Vending Machine," Ser. No. 62/575,865, filed Oct. 23, 2017, and a second prior-filed U.S. provisional patent application titled "Brushless Motor and Switch for Vending Machine," Ser. No. 62/699,509, filed Jul. 17, 2018. The entire contents of the identified prior-filed applications are incorporated by reference into the present application as if fully set forth herein.

FIELD

The present invention relates to vending and other dispensing machine technology, and more particularly, embodiments concern a drive system for a vending or other dispensing machine, the drive system including an electronic switch and a brushless motor configured to actuate dispensing coils or similar dispensing technologies, wherein the drive system minimizes the risk of sparking and igniting propane or other refrigerants or other volatile chemicals used in or near the machine.

BACKGROUND

In many prior art vending machines, instances of products are received and retained within dispensing coils and released when the dispensing coils are rotated. Some vending machines use a brush direct current (DC) electric motor and an electro-mechanical switch to drive the dispensing coils. When activated, the switch closes and the brush DC motor rotates a particular dispensing coil, which causes an instance of a selected product to be dispensed and delivered to a user. Typically, vending machines may incorporate homing circuits for controlling this dispensing operation.

Some vending machines use a refrigerant coolant, such as R-134a, to cool the instances of the products stored in the dispensing coils. However, government regulations may limit or eliminate the use of such refrigerants in vending machines, and the vending machine industry may switch to using propane as a refrigerant in their compressors. Propane is volatile, and the brush DC motor and/or the electro-mechanical switch may create an electrical spark when operated, which could ignite any propane that has escaped from the refrigeration system. Incorporating a housing to cover an existing brush DC motor and/or the electro-mechanical switch can increase cost and complexity. Further, an additional housing cover may result in additional "explosion-proof" certification requirements, such as UL certification, which can increase cost and development timelines. Other disadvantages of the housing cover could include required certification of the seal, degradation of the seal over time, increased cost, and risk of failure of the seal at any point.

This background discussion is intended to provide information related to the present invention which is not necessarily prior art.

SUMMARY

Embodiments address the above-described and other problems by providing a drive system for a vending or other dispensing machine, the drive system including an electronic switch and a brushless DC electric motor configured to actuate dispensing coils or other dispensing technologies, wherein the drive system minimizes the risk of sparking and igniting propane or other volatile refrigerants or other volatile chemicals used in or near the machine.

In a first embodiment of the present invention, a drive system is provided for a dispensing machine containing an instance of an item. The drive system may include an item dispenser and an electronic switch. The item dispenser is rotatable at least in part to advance and release the instance of the item. The electronic switch may be configured to cause an electric motor to impart rotation to the item dispenser in response to a control signal, thereby releasing the instance of the item, wherein the electronic switch does not create an electrical spark when operating.

In a second embodiment of the present invention, a vending machine is provided containing an instance of a product and including a drive system. The drive system may include a dispensing coil and an electronic switch. The dispensing coil may be configured to receive and retain the instance of the product, and to rotate to advance and release the instance of the product. The electronic switch may be configured to cause an electric motor to rotate the dispensing coil in response to a control signal, thereby releasing the instance of the product, wherein the electronic switch does not create an electrical spark when opening or closing.

Various implementations of the foregoing embodiments may include any one or more of the following additional features. The electronic switch may be a Hall effect switch, and/or the electric motor may be a brushless DC electric motor. The vending or other dispensing machine may include a homing circuit electrically connected to the drive system and configured to monitor rotation of the dispensing coil or other mechanism. The homing circuit may sense an interruption of electrical current associated with opening and closing the electronic switch. The homing circuit may sense a high frequency modulated signal over a current sensing resistor associated with opening and closing the electronic switch. The homing circuit may sense a power supply voltage over an additional wire to the electric motor and associated with opening and closing the electronic switch. The drive system may include a wiring harness electrically connecting the electronic switch to the electric motor, wherein the wiring harness includes a connector component which is selectively configurable to allow the electric motor to operate in a clockwise direction or in a counterclockwise direction. The vending or other dispensing machine may include a refrigeration system configured to cool the instance of the product or other item, wherein the refrigeration system uses propane.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein.

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment," "an embodiment," or "embodiments" mean that the feature or features referred to are included in at least one embodiment of the invention. Separate references to "one embodiment," "an embodiment," or "embodiments" in this description do not necessarily refer to the same embodiment and are not mutually exclusive unless so stated. Specifically, a feature, component, action, step, etc. described in one embodiment may also be included in other embodiments, but is not necessarily included. Thus, particular implementations of the present invention can include a variety of combinations and/or integrations of the embodiments described herein.

Broadly characterized, embodiments provide a drive system for a vending or other dispensing machine, the drive system including an electronic switch and a brushless DC electric motor configured to actuate dispensing coils or other dispensing technologies, wherein the drive system minimizes the risk of sparking and igniting propane or other volatile refrigerants or other volatile chemicals used in or near the machine. Embodiments of the drive system may be configured to be efficiently, conveniently, and economically incorporated into existing and new vending machines.

Figure 1:
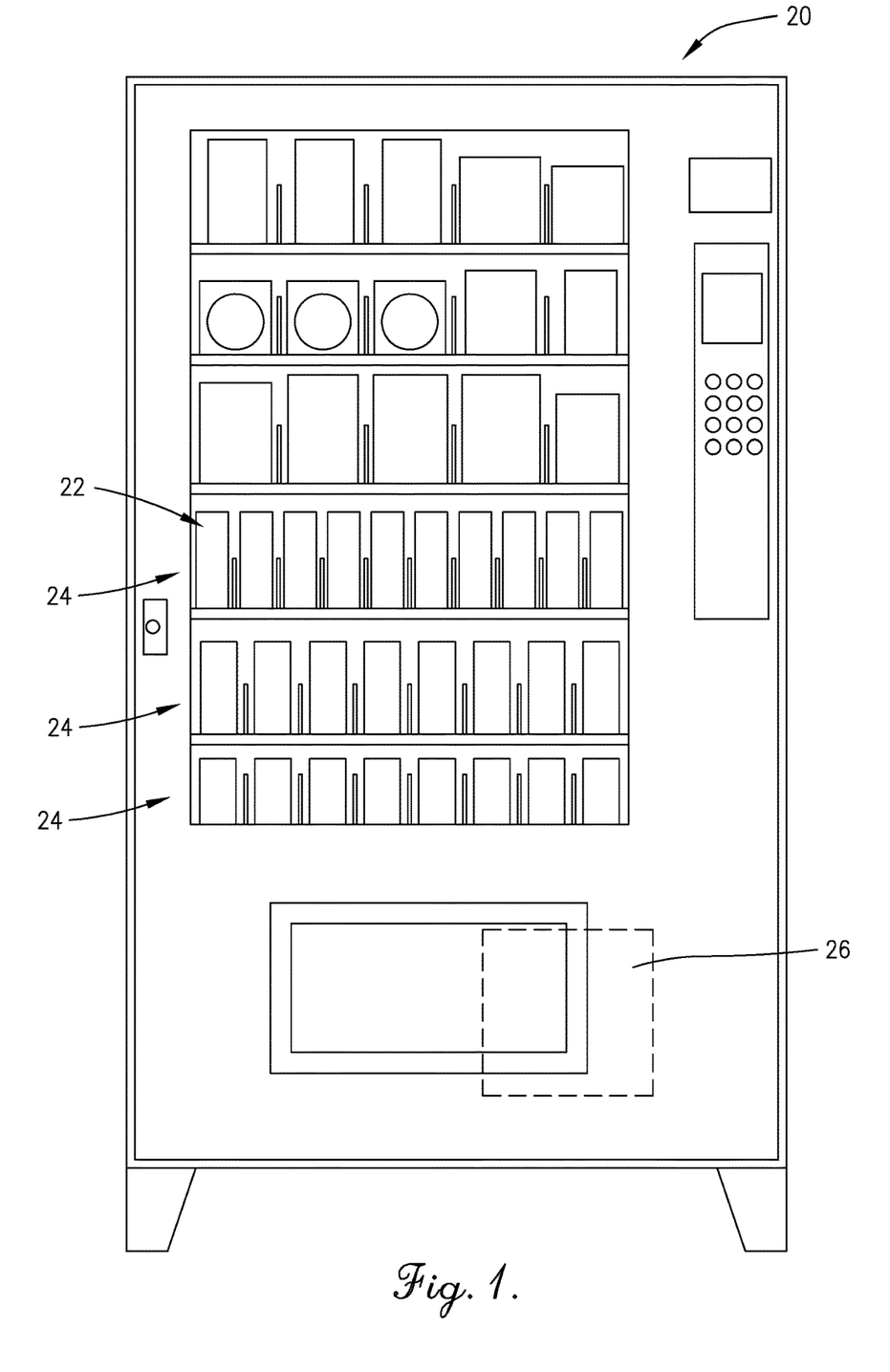
FIG. 1 is a front elevation view of an example vending machine.
Figure 2:
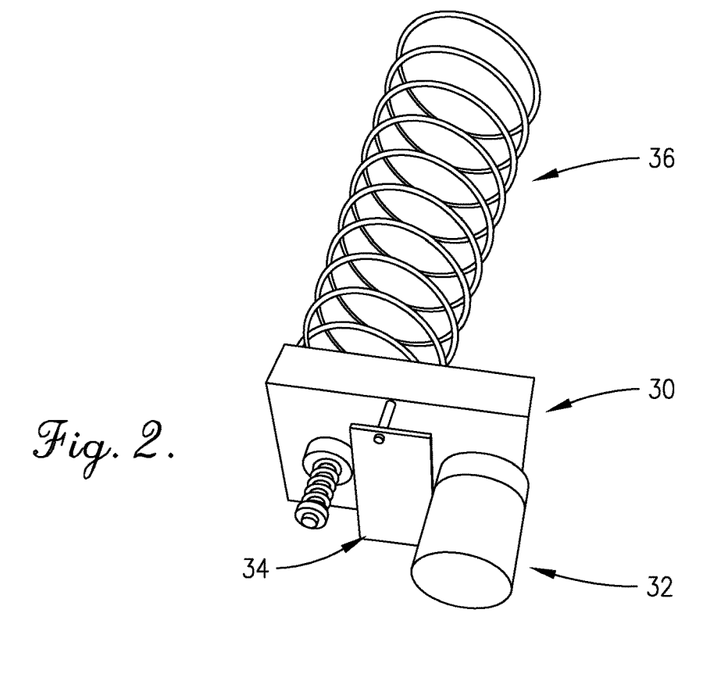
FIG. 2 is an isometric view of an embodiment of a drive system, including an electric motor and a switch, which may be incorporated into the example vending machine of FIG. 1 to drive a dispensing coil.

Referring to FIG. 1, an example dispensing machine 20 is shown which may incorporate the drive system of the present invention. The illustrated dispensing machine 20 is particularly configured for containing and dispensing one or more instances 22 of one or more products or other items 24, and may include a refrigeration system 26 to cool the instances 22 of the products 24. The refrigeration system 26 may use propane or another volatile refrigerant, or the vending machine 20 may be located near volatile chemicals or materials. Referring to FIG. 2, an example drive system 30 is shown including an electric motor 32 and a switch 34 which may be incorporated into the vending machine 20 to drive one or more item dispensers 36 for dispensing the instances 22 of the products 24.

The illustrated item dispensers 36 are most preferably rotatable dispensing coils configured to receive and retain instances of products and dispense product when rotated, although the vending machine 20 may be provided with an alternative or additional item dispenser(s) without departing from certain aspects of the present invention. It will be appreciated that various dispensing technologies are entirely or at least partly rotatable when dispensing product, with rotation being imparted by the motor 44. For example, the machine 20 might alternatively or additionally include a conveyor, lift, and/or robotic arm (each of which is rotatable or includes a rotatable portion) used to dispense product.

The term "homing" refers to the manner in which a homing circuit controls and/or monitors one rotation, or vend, of the item dispenser 36. A first common way of homing is to sense an interruption of electrical current to the power supply. In brief, a power supply line is interrupted by the contacts of the mechanical switch 42, which is activated by an output gear cam, during travel time between a normally closed (NC) contact and a normally open (NO) contact. A second common way of homing is to sense a high frequency modulated power supply signal over a current sensing resistor. In brief, a five (5) volt (V), alternating current (AC), ninety (90) kiloHertz (kHz) signal is connected to the twenty four (24) VDC power supply. The electro-mechanical switch 48, which is activated by the output gear cam, connects in parallel to the motor 50 which makes the high frequency modulated signal visible over the current sensing resistor 52. A third common way of homing is to sense a power supply voltage over a third wire. The electro-mechanical switch, activated by the output gear cam, provides the supply voltage to the third wire. Thus, the first and second homing technologies require only two wires going to the motor, while the third homing technology requires three wires.

Figure 3:
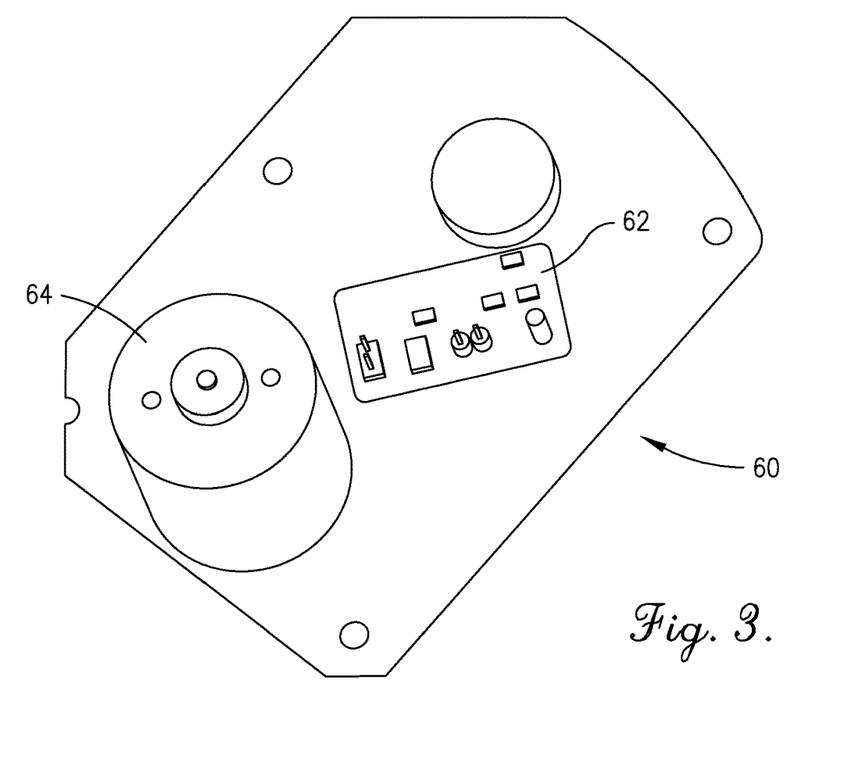
FIG. 3 is a perspective view of an embodiment of a drive system including an electronic switch and/or a brushless DC electric motor.

Referring to FIG. 3 an embodiment of a drive system 60 is shown which may be incorporated into the vending machine 20. The drive system 60 may include an electronic switch 62, such as a Hall effect switch, or Hall switch, and/or a brushless DC motor 64. In various implementations, the drive system 60 may include only the electronic switch 62 (and a brush motor), only the brushless motor 64 (and an electro-mechanical switch), or both the electronic switch 62 and the brushless motor 64. As stated, the drive system 60 may be configured for incorporation into new or existing vending machines, such as the vending machine 20 of FIG. 1, and as desired, to connect to a homing circuit. In particular, use of the electronic switch 62 in place of an electro-mechanical switch and/or the brushless motor 64 in place of a brush motor minimizes or eliminates the risk of sparks which might otherwise ignite escaped propane or other volatile gases, fluids, chemicals, or materials.

Figure 4:
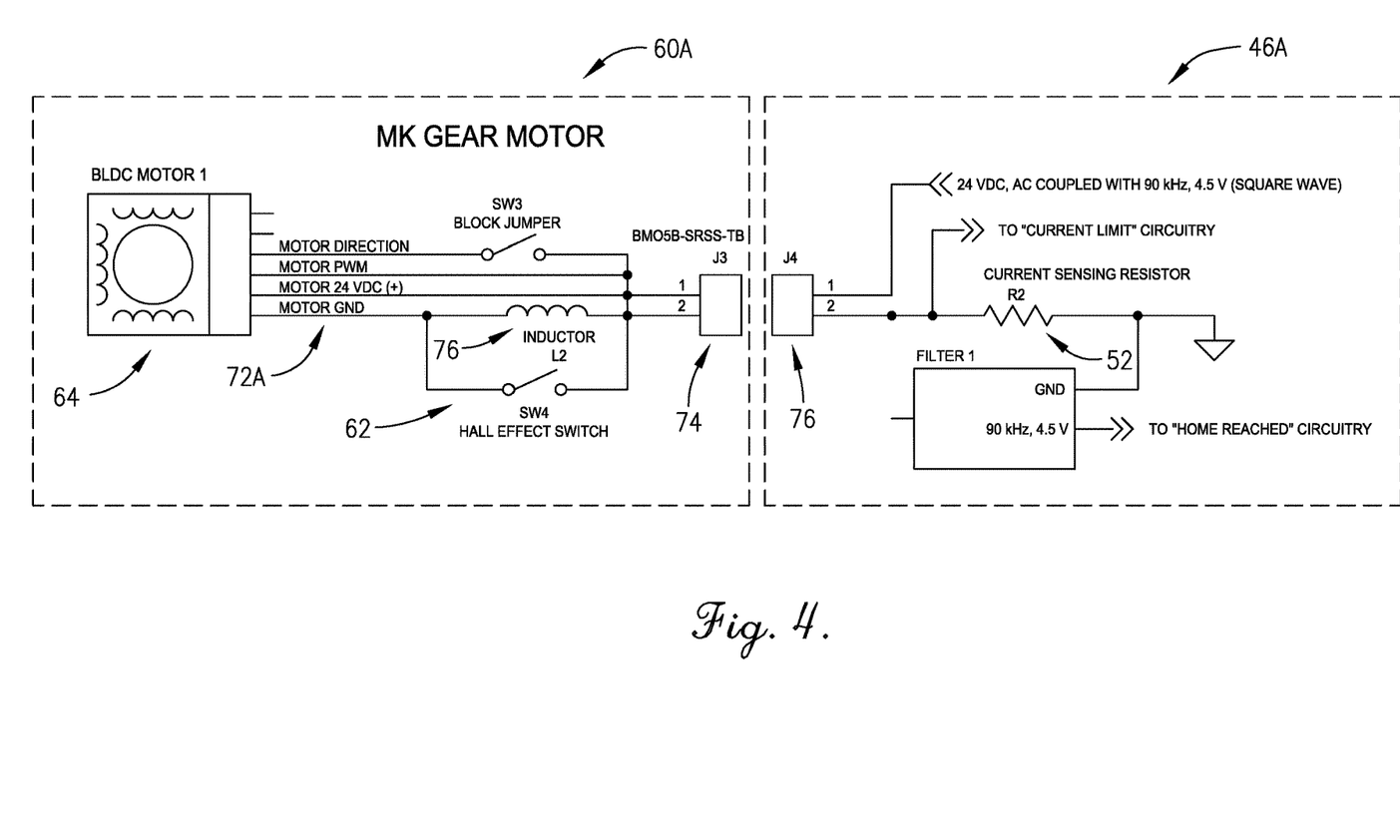
FIG. 4 is a circuit schematic of a first implementation of the drive system of FIG. 3 connected to an implementation of a homing circuit.
Figure 5:
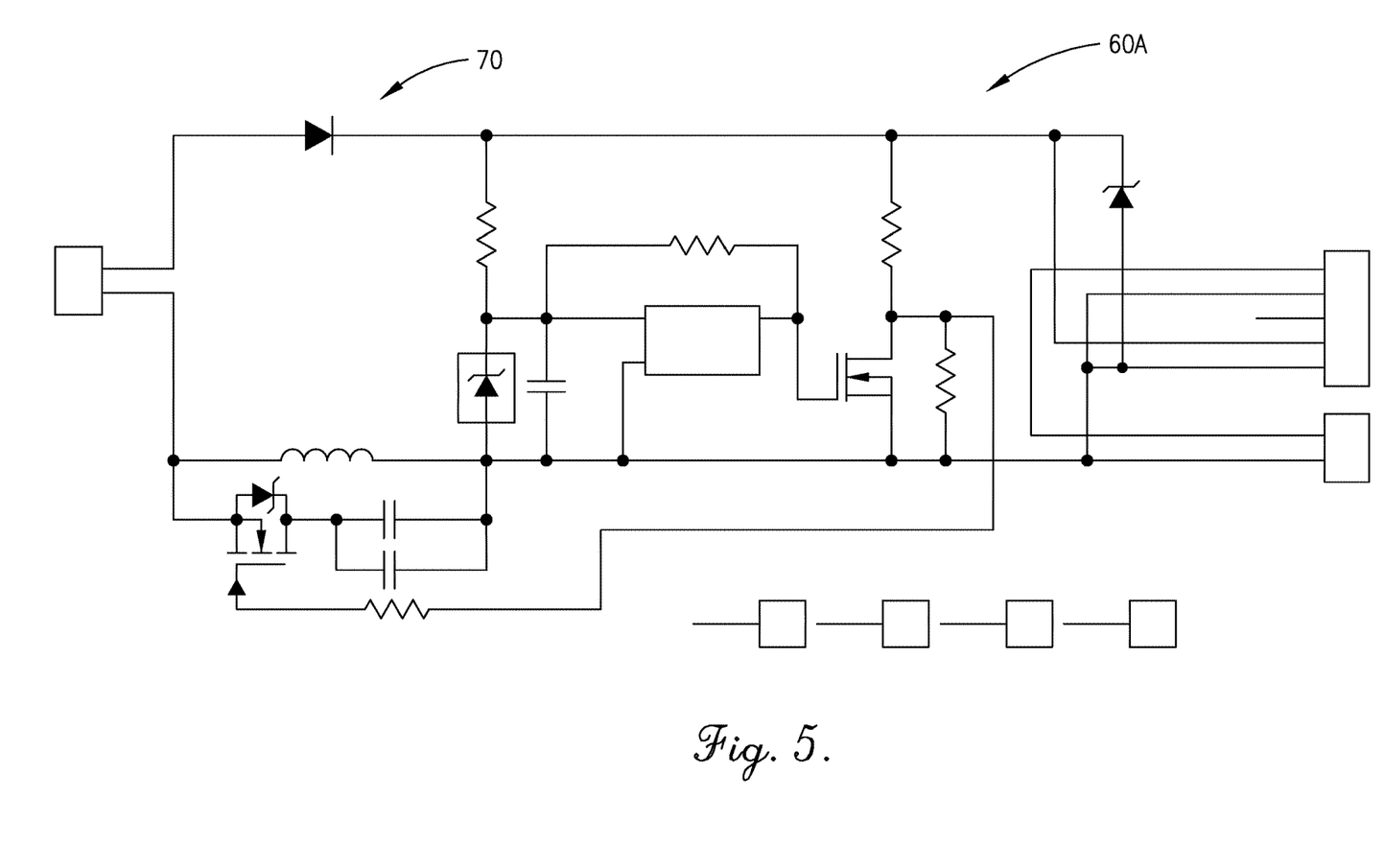
FIG. 5 is a printed circuit board assembly schematic of a first implementation of aspects of the drive system of FIG. 4.
Figure 6:
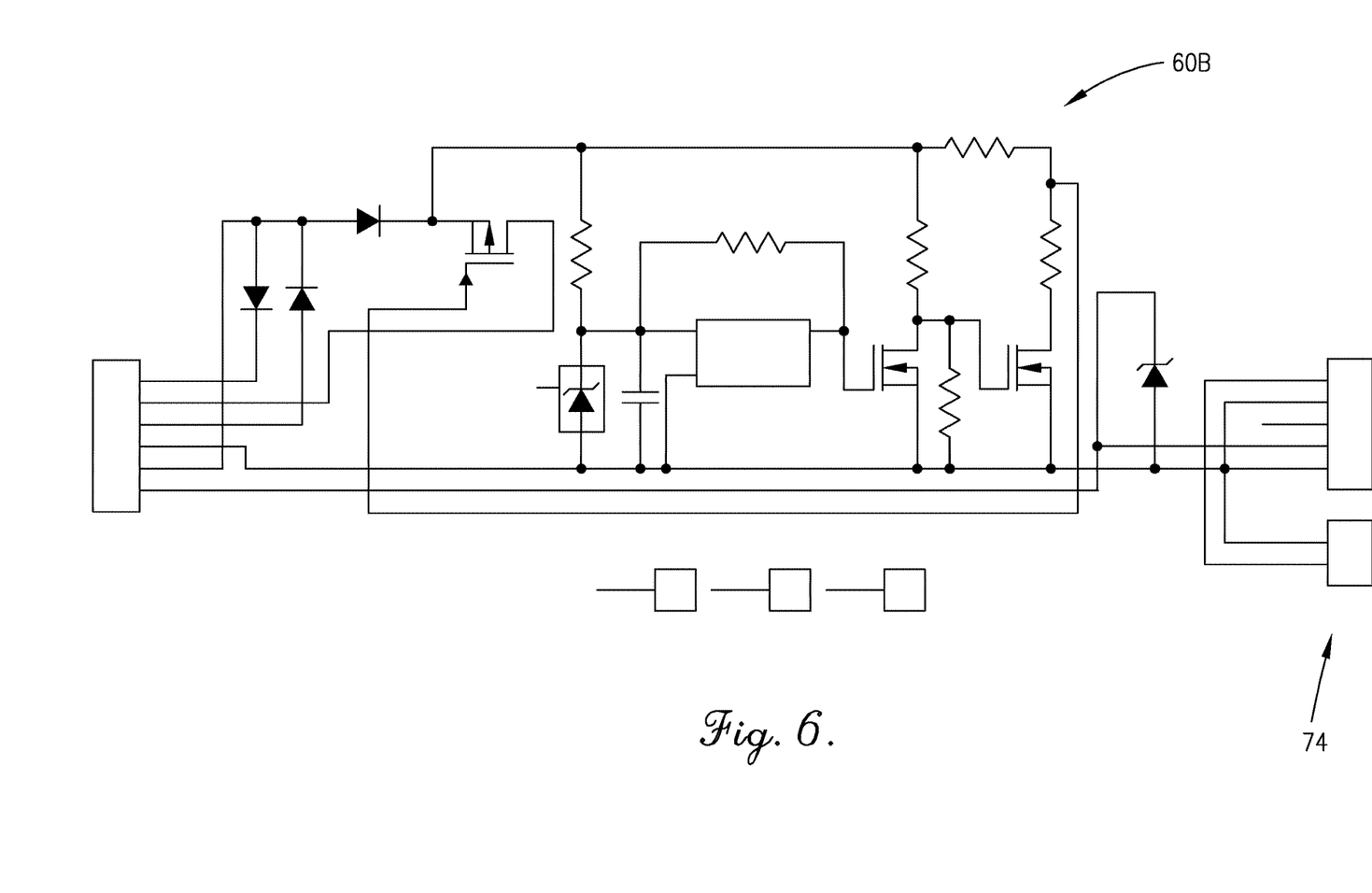
FIG. 6 is a printed circuit board schematic of a second implementation of aspects of the drive system of FIG. 3.
Figure 7:
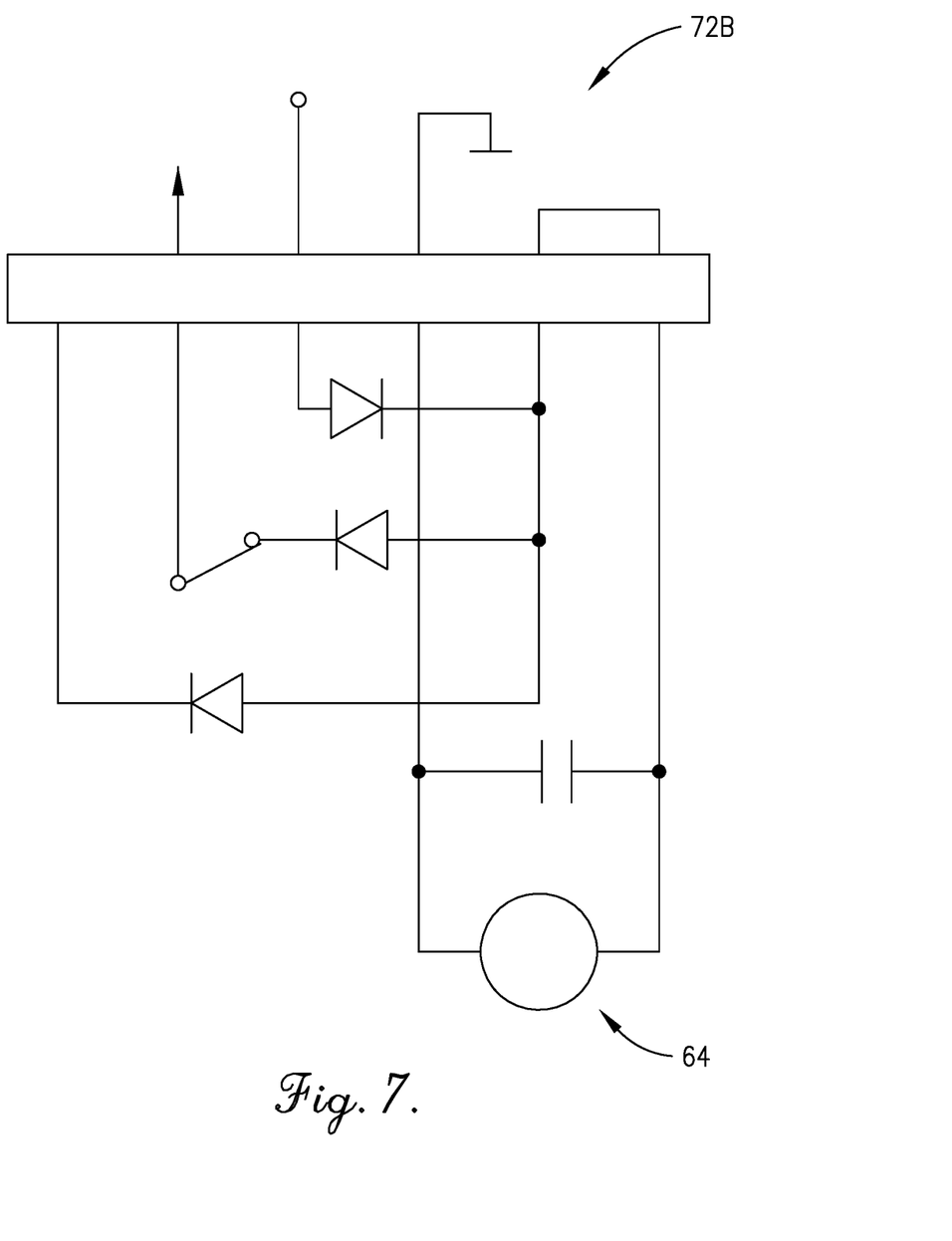
FIG. 7 is a harness wiring schematic for the second implementation of the drive system of FIG. 6.
Figure 8:
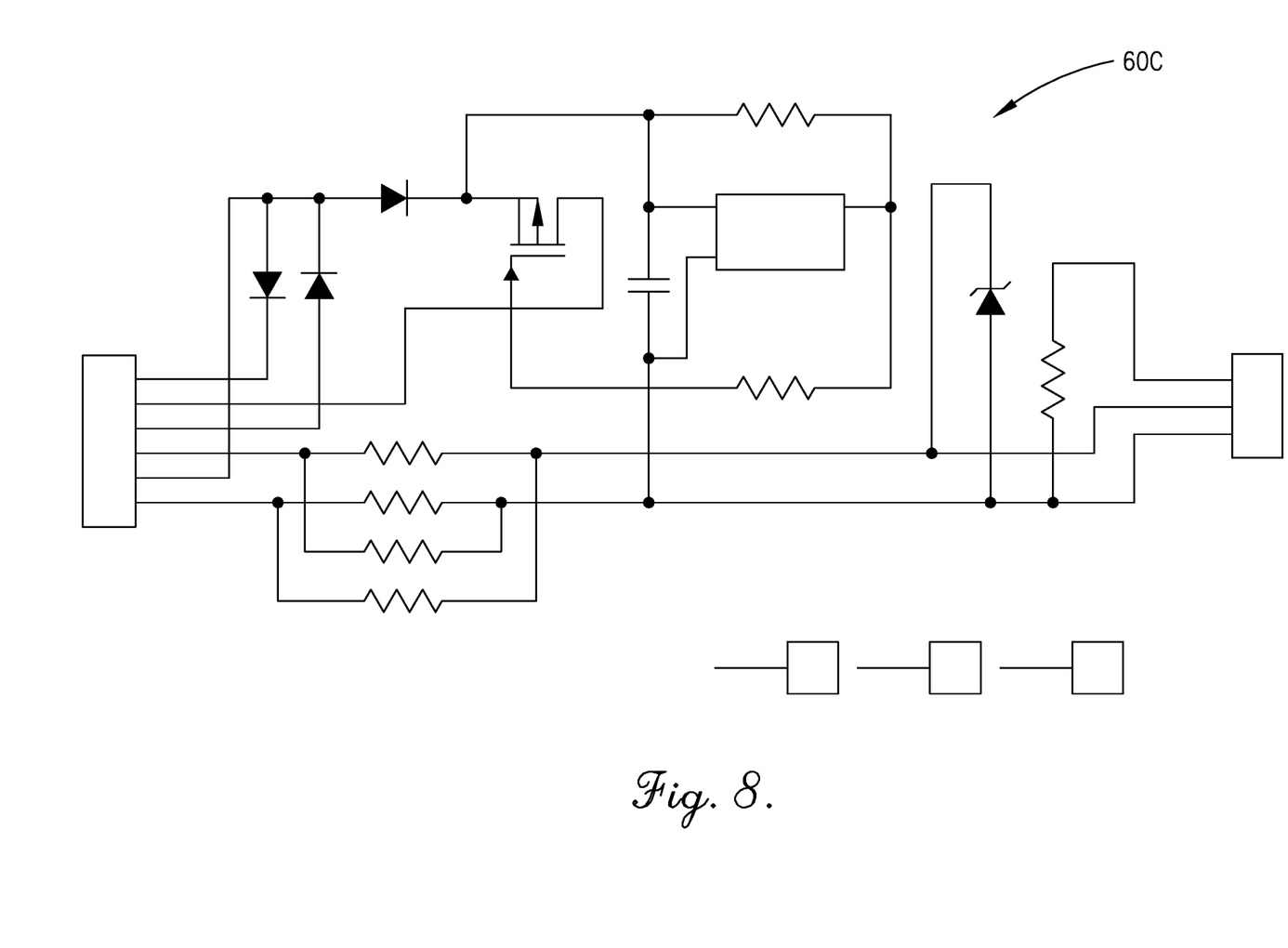
FIG. 8 is a circuit schematic of a third implementation of aspects of the drive system of FIG. 3.
Figure 9:
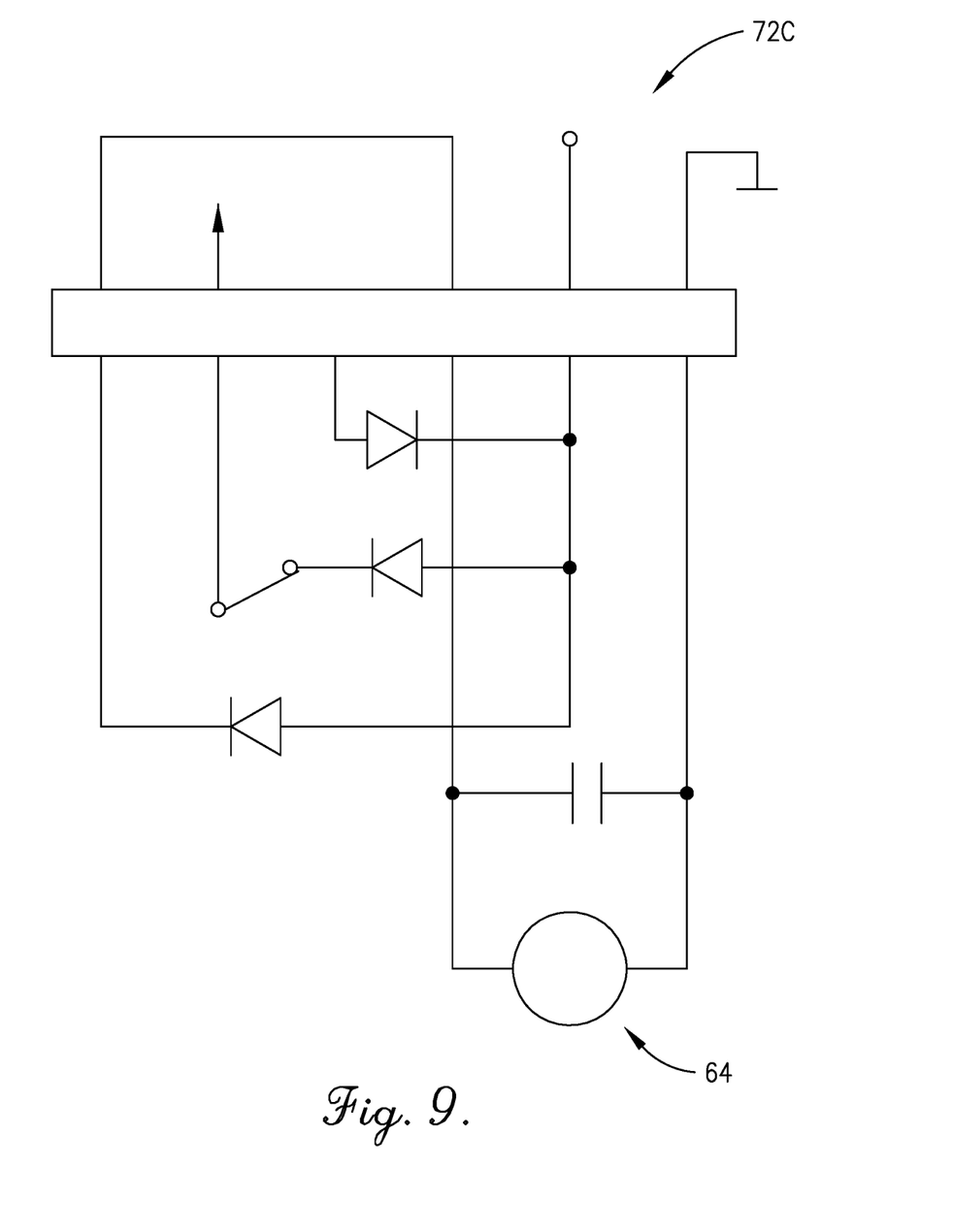
FIG. 9 is a harness wiring schematic for the third implementation of the drive system of FIG. 8.

Referring to FIGS. 4 and 5, a first implementation of the drive system 60A is shown connected with an implementation of a homing circuit 46A of the second homing technology. A diode 70 may be inserted into the power supply line to protect against certain fault conditions which may be encountered in vending machines. A wiring harness 72A may connect the electronic switch 62 to the motor 64. The wiring harness 72A may carry substantially any relevant signals to and/or from the motor 64, such as a direction signal to the motor 64, a pulse width modulated (PWM) signal to the motor 64, a power supply signal to the motor 64, and a ground connection to the motor 64. To facilitate connection of the drive system 60A to existing or other circuitry 46A, an electrical connector 74 may be provided for connecting to a complementary electrical connector 76 on the existing or other circuitry 46A. In FIGS. 6-9, alternative implementations of the drive system 60B, 60C are shown, particularly the electronic switch 62 and the associated wiring harnesses 72B, 72C to the motor 64.

In each of these implementations 60A, 60B, 60C, the electronic switch 62 may be a Hall effect switch configured to function like a typical electro-mechanical switch. Further, each of these implementations may be configured, with the addition of an inductor 74 (seen in FIG. 4), to work with the brushless motor 64 or to work with a brush motor. The brushless motor 64 may be configured to perform the same functions as the prior art two-wire brush motor. A customer-configurable connector, which may be part of the wiring harness 72A, 72B, 72C, may be provided in any of the implementations 60A, 60B, 60C to allow the motor 64 to operate clockwise (CW) or counterclockwise (CCW), thereby conveniently allowing the customer to stock only one part number for both clockwise (CW) or counterclockwise (CCW) applications. This option is particularly relevant for use with the third homing technology.

Although described herein for the purpose of illustration as being adapted for use in the example context of product vending machines using volatile refrigerants, it will be appreciated that the drive system of the present invention may be adapted for use with substantially any technology and in substantially any context which might benefit from the advantages provided by the drive system. For example, embodiments of the drive system may be adapted for use in vending machines that do not themselves use but that operate in proximity to volatile chemicals or materials, and/or embodiments may be adapted for use in machines that dispense components or materials to workers in industrial contexts. Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A vending machine containing an instance of a product, the vending machine comprising:
   a homing circuit;
   a refrigeration system configured to cool the instance of the product, wherein the refrigeration system uses a volatile gas; and
   a drive system including
      a dispensing coil configured to receive and retain the instance of the product, and to rotate to advance and release the instance of the product, wherein the homing circuit is configured to control rotation of the dispensing coil,
      a brushless direct current electric motor mechanically connected to the dispensing coil,
      an electronic Hall effect switch configured to cause the brushless direct current electric motor to rotate the dispensing coil in response to a control signal from the homing circuit, thereby releasing the instance of the product, wherein the homing circuit senses a high frequency modulated signal over a current sensing resistor associated with operation of the electronic Hall effect switch, and wherein neither the electronic Hall effect switch nor the brushless direct current electric motor creates a spark which could ignite the volatile gas, and
      a wiring harness electrically connecting the electronic Hall effect switch to the brushless direct current electric motor, wherein the wiring harness is selectively configurable to allow the brushless direct current electric motor to operate in a clockwise direction or in a counterclockwise direction.

2. A vending machine containing an instance of a product, the vending machine comprising:
   a homing circuit;
   a refrigeration system configured to cool the instance of the product, wherein the refrigeration system uses a volatile gas; and
   a drive system including
      a dispensing coil configured to receive and retain the instance of the product, and to rotate to advance and release the instance of the product, wherein the homing circuit is configured to control rotation of the dispensing coil,
      a brushless direct current electric motor mechanically connected to the dispensing coil,
      an electronic Hall effect switch configured to cause the brushless direct current electric motor to rotate the dispensing coil in response to a control signal from the homing circuit, thereby releasing the instance of the product, wherein the homing circuit senses a power supply voltage over an additional wire to the brushless direct current electric motor and associated with operation of the electronic Hall effect switch, and wherein neither the electronic Hall effect switch nor the brushless direct current electric motor creates a spark which could ignite the volatile gas, and
      a wiring harness electrically connecting the electronic Hall effect switch to the brushless direct current electric motor, wherein the wiring harness is selectively configurable to allow the brushless direct current electric motor to operate in a clockwise direction or in a counterclockwise direction.

* * * * *